United States Patent
Wayman

(10) Patent No.: US 7,672,134 B2
(45) Date of Patent: Mar. 2, 2010

(54) APPARATUS FOR DIRECTING HEAT TO A HEAT SPREADER

(75) Inventor: Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 42 days.

(21) Appl. No.: 11/948,765

(22) Filed: Nov. 30, 2007

(65) Prior Publication Data

US 2009/0141452 A1     Jun. 4, 2009

(51) Int. Cl.
    *H05K 7/20* (2006.01)
(52) U.S. Cl. .................. 361/704; 361/709; 361/710; 165/80.3
(58) Field of Classification Search ......... 361/702–712, 361/715–719, 722–724; 257/706–727; 174/15.1, 174/16.1, 16.3, 252, 256, 258; 165/80.3, 165/80.4, 104.33, 103.34, 185, 905; 438/106, 438/122; 428/320.2, 322.7, 304.4, 304.6
See application file for complete search history.

(56) References Cited

U.S. PATENT DOCUMENTS

| | | | |
|---|---|---|---|
| 5,494,753 A * | 2/1996 | Anthony | 428/408 |
| 5,863,467 A | 1/1999 | Mariner et al. | |
| 5,958,572 A | 9/1999 | Schmidt et al. | |
| 5,969,949 A * | 10/1999 | Kim et al. | 361/704 |
| 6,104,090 A * | 8/2000 | Unger et al. | 257/729 |
| 6,131,651 A | 10/2000 | Richy, III | |
| 6,407,922 B1 | 6/2002 | Eckblad et al. | |
| 6,469,381 B1 * | 10/2002 | Houle et al. | 257/707 |
| 6,585,925 B2 * | 7/2003 | Benefield | 264/255 |
| 6,661,317 B2 * | 12/2003 | Ali et al. | 333/247 |
| 6,680,015 B2 * | 1/2004 | McCullough | 264/105 |
| 6,691,768 B2 * | 2/2004 | Hsieh et al. | 165/80.3 |
| 6,758,263 B2 * | 7/2004 | Krassowski et al. | 165/185 |
| 6,771,502 B2 * | 8/2004 | Getz et al. | 361/703 |
| 6,898,084 B2 * | 5/2005 | Misra | 361/710 |
| 6,977,814 B2 * | 12/2005 | Hornung | 361/690 |
| 7,053,295 B2 | 5/2006 | Murasawa | |
| 7,108,055 B2 * | 9/2006 | Krassowski et al. | 165/185 |
| 7,176,564 B2 | 2/2007 | Kim | |
| 7,195,951 B2 * | 3/2007 | Houle et al. | 438/106 |
| 7,202,309 B2 | 4/2007 | Furrer et al. | |

(Continued)

OTHER PUBLICATIONS

"TC1050 Thermal Management Materials", "GE Advanced Ceramics", Sep. 2003, pp. 1-2, Publisher: General Electric Company.

(Continued)

*Primary Examiner*—Michael V Datskovskiy
(74) *Attorney, Agent, or Firm*—Fogg & Powers LLC

(57) ABSTRACT

An apparatus for dissipating heat from a device is provided. The apparatus includes a heat sink having an elongated shape and defining a groove. A heat spreader composed of a non-isotropic thermal conductor is positioned at least partially within the groove of the heat sink and thermally coupled to the heat sink. The heat spreader is oriented such that the thermal conductor propagates heat along a length of the heat sink. A heat channel composed of a non-isotropic thermal conductor is positioned at least partially within the groove of the heat sink and thermally coupled to the heat spreader. The heat channel is oriented to propagate heat towards the heat spreader.

9 Claims, 6 Drawing Sheets

U.S. PATENT DOCUMENTS

| | | | |
|---|---|---|---|
| 7,219,721 | B2 | 5/2007 | Miyazaki et al. |
| 7,220,485 | B2 | 5/2007 | Sayir et al. |
| 7,328,508 | B2 * | 2/2008 | Edwards et al. .......... 29/890.03 |
| 7,431,072 | B2 * | 10/2008 | Miyazaki et al. ........... 165/80.3 |
| 2004/0177947 | A1* | 9/2004 | Krassowski et al. .... 165/104.33 |
| 2004/0223303 | A1* | 11/2004 | Hornung ..................... 361/704 |
| 2005/0006054 | A1 | 1/2005 | Miyazaki et al. |
| 2007/0053168 | A1 | 3/2007 | Sayir et al. |
| 2007/0062676 | A1* | 3/2007 | Yao ....................... 165/104.33 |
| 2007/0086196 | A1 | 4/2007 | Wong |
| 2007/0107872 | A1 | 5/2007 | Mayazaki et al. |
| 2007/0108595 | A1 | 5/2007 | Refai-Ahmed |
| 2007/0257359 | A1 | 11/2007 | Reis et al. |
| 2009/0032217 | A1 | 2/2009 | Wayman |
| 2009/0032218 | A1 | 2/2009 | Wayman |
| 2009/0032234 | A1 | 2/2009 | Wayman et al. |
| 2009/0141452 | A1 | 6/2009 | Wayman |

OTHER PUBLICATIONS

"TPG Thermal Management Material", "GE Advanced Ceramics", Sep. 2003, pp. 1-2, Publisher: General Electric Company.

DTI Global Watch Mission Report, "Developments and Trends in Thermal Management Technologies-a Mission to the USA", Feb. 2007, Publisher: Pera on behalf of Department of Trade and Industry.

Motesano, Mark J., "Annealed Pyrolytic Graphite", Jun. 2006, Publisher: Advanced Materials & Processes.

* cited by examiner

APPARATUS FOR DIRECTING HEAT TO A HEAT SPREADER

CROSS REFERENCE TO RELATED APPLICATIONS

This application is related to co-pending U.S. patent application Ser. No. 11/831,561 having a title of "APPARATUS FOR TRANSFERRING HEAT IN A FIN OF A HEAT SINK" (also referred to here as the "'561 Application") and U.S. patent application Ser. No. 11/692,026 having a title of "MODULARIZED RADIO FREQUENCY BAND COMPONENTS ON REMOVABLE DOORS" (also referred to here as the "'026 Application"). The '561 Application and the '026 Application are hereby incorporated herein by reference.

BACKGROUND

For many devices, removing heat is essential in order to keep the device operating effectively. Often, to aid in removal of heat, a heat sink is coupled to the device. A heat sink is generally a metal component with a flat base on one side and a number of fins on the other. The flat base is coupled to the heat producing device with the fins extending out from the base. The fins increase the surface area available for heat dissipation to the surrounding environment. Often, however, heat from the electronic device does not propagate evenly from the heat generating device to all areas of the heat sink. This results in localized "hot spots" near the location of the greatest heat transfer into the heat sink. Because heat propagates slowly through metal heat sinks, some areas of the heat sink may contain large amounts of heat while other areas are relatively cool. Thus, the heat sink is not cooling up to its potential, because heat is being dissipated effectively from only a portion of the surface area on the heat sink.

One area of a heat sink which can cause slow heat propagation is the fins. The difficulty occurs because heat concentrates in one area along the fin. This results in the fin not dissipating heat at its potential, because the heat is not adequately spread along the fin. Another problem arises because heat concentrates at the base of the fin. Thus, the full surface area of the fin is not utilized to its potential because heat has difficulty reaching the tip of the fin. Further, even if the heat does reach the tip of the fin, the speed of propagation of the heat through the fin may be slower than needed or desired to adequately dissipate heat.

The heat dissipation problems are increased when using heat sinks with electronic devices, because many electronic devices generate a large amount of heat in a relatively small area. These electronic devices contain many electronic components which require dissipation of heat. Generally, to dissipate the heat from the plurality of components, a large heat sink is thermally coupled to each of the electronic components. Some electronic components, however, generate more heat than others. A component that generates a large amount of heat can flood an area of the heat sink with heat such that adjacent components can not adequately dissipate heat to the heat sink. Heat from the hotter components increases the heat of the heat sink in an area at or above the temperature of the adjacent components. When this occurs, heat from the adjacent components will no longer propagate toward the heat sink. Thus, the adjacent electronic components have difficulty effectively dissipating heat.

For the reasons stated above, and for other reasons stated below which will become apparent to those skilled in the art upon reading and understanding the present specification, there is a need in the art for an apparatus and method for improving heat dissipation from electronic devices.

SUMMARY

An apparatus for dissipating heat from a device is provided. The apparatus includes a heat sink having an elongated shape and defining a groove. A heat spreader composed of an anisotropic thermal conductor is positioned at least partially within the groove of the heat sink and thermally coupled to the heat sink. The heat spreader is oriented such that the thermal conductor propagates heat along a length of the heat sink. A heat channel composed of anisotropic thermal conductor is positioned at least partially within the groove of the heat sink and thermally coupled to the heat spreader. The heat channel is oriented to propagate heat towards the heat spreader.

BRIEF DESCRIPTION OF THE DRAWINGS

The present invention can be more easily understood, and further advantages and uses thereof are more readily apparent, when considered in view of the detailed description and the following figures in which.

In accordance with common practice, the various described features are not drawn to scale but are drawn to emphasize specific features relevant to the present invention.

DETAILED DESCRIPTION

In the following detailed description, reference is made to the accompanying drawings that form a part hereof, and in which is shown by way of illustration specific illustrative embodiments in which the method and system may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide for an apparatus for channeling heat from one location to a heat sink and then spreading the heat across the heat sink for dissipation into the surrounding environment. A heat channel made of an anisotropic heat conductor directs heat to propagate easily from a heat source to a heat spreader within the heat sink. The heat channel directs the heat towards the heat spreader by providing an easy avenue from the heat source to the heat spreader along which the heat can propagate. The heat spreader is coupled to the heat channel and the heat spreader spreads the heat along the heat sink for propagation into the surrounding environment.

Figure 1:
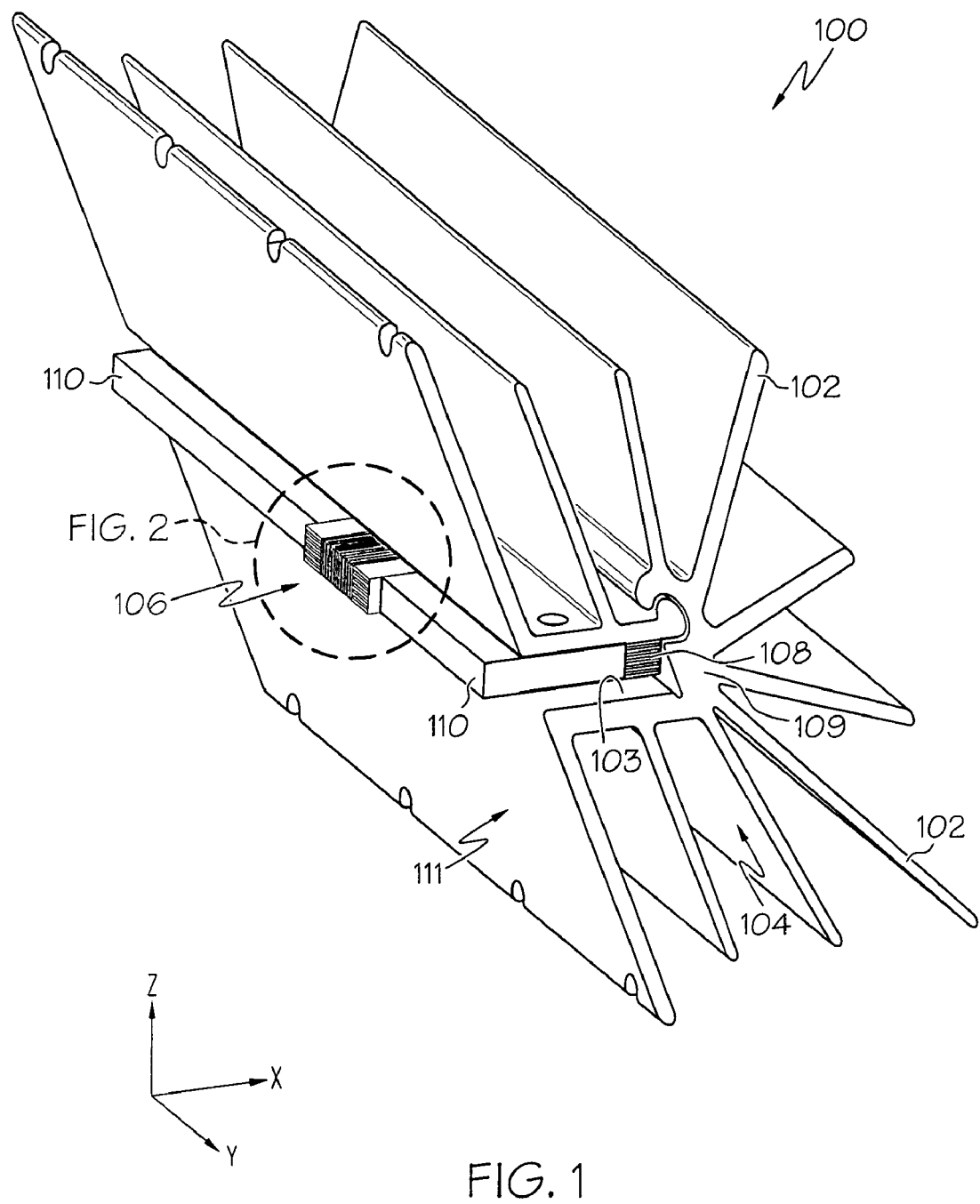
FIG. 1 is a perspective view of one embodiment of a heat sink having a heat channel and a heat spreader.

FIG. 1 is a perspective view of one embodiment of a heat sink 100 for channeling heat from a heat generating component to heat sink 100 for dissipation into the surrounding environment. Heat sink 100 includes, a plurality of fins 102 on a main body 104, a heat channel 106, a heat spreader 108, and filler blocks 110. As shown in FIG. 1, main body 104 of heat sink 100 is an elongated structure having a groove 103 along the main body 104 and a plurality of fins 102 for dissipating heat. Main body 104 has a "U" shape with groove 103 opening toward the negative x-axis as shown in FIG. 1. Additionally, main body 104 is elongated along the y axis. Fins 102 increase the surface area of heat sink 100 and, therefore, increase the heat dissipation from heat sink 100. In this embodiment, eight (8) fins 102 are shown, however, in other embodiments, any number of fins 102 may be used. Each of the plurality of fins 102 projects out from an outer surface of heat sink 100. In this embodiment, fins 102 are slim ridges which extend radially outward from main body 104 of heat sink 100 and are elongated parallel to one another along heat sink 100. In other embodiments, fins 102 are obelisk type structures, or other shapes as known to those skilled in the art.

In one embodiment, main body 104 and fins 102 are composed of aluminum. In an alternative embodiment, main body 104 and fins 102 are composed of steel. In other embodiments, main body 104 and fins 102 are composed of other materials that conduct heat, or a combination of materials that conduct heat.

Heat channel 106 and heat spreader 108 direct heat from a heat generating component (shown in FIG. 3) toward a vertex 109 of heat sink 100. Heat channel 106 and heat spreader 108 are composed of an anisotropic thermal material. An anisotropic thermal material is a material that conducts heat better in one plane than it does in another plane. For example, in one embodiment, heat channel 106 and heat spreader 108 are thermal pyrolytic graphite (TPG). TPG is commercially available from Momentive Performance Materials in Wilton, Connecticut. TPG may be referred to as highly oriented pyrolytic graphite (HOPG), or compression annealed pyrolytic graphite (CAPG), and refers to graphite materials consisting of crystallites of considerable size, the crystallites being highly aligned or oriented with respect to each other and having well ordered carbon layers or a high degree of preferred crystallite orientation, with an in-plane thermal conductivity greater than 1000 W/m-K. In one embodiment, TPG has an in-plane thermal conductivity of approximately 1,500 W/m-K.

In one embodiment, TPG is formed as described in U.S. Pat. No. 5,863,467 which is hereby incorporated herein by reference. Briefly, to manufacture heat sink 100 with TPG, pyrolytic graphite is heat treated to form the pyrolytic graphite into a crystal structure. The resulting crystal structure, TPG, has a high in plane conductivity, and is cut into strips which are placed within heat sink 100. In an alternative embodiment, thermal material for heat channel 106 and/or heat spreader 108 is a diamond-like-carbon (DLC) or a diamond material having a high in-plane thermal conductivity.

Heat channel 106 and heat spreader 108 form a "T" shape that channels heat from a base 111 of heat sink 100 toward vertex 109, and then spreads heat along heat sink 100. In this embodiment, heat channel 106 is oriented such that the in-plane conduction is aligned with the x axis in FIG. 1. Thus, heat propagates through heat channel 106 from base 111 of heat sink 100 toward vertex 109 of heat sink 100. One end of heat channel 106 is positioned near a heat source and the other end is coupled to heat spreader 108. Similar to heat channel 106, heat spreader 108 is composed of an anisotropic thermal material and positioned along vertex 109 of heat sink 100. Heat spreader 108 is oriented such that the in-plane conduction is aligned with the y axis, thus, heat spreader 108 spreads heat along heat sink 100.

Advantageously, the "T" shape of heat channel 106 allows heat to be channeled directly from a small location near the end of heat channel 106 and spread across a large area (e.g. heat sink 100) for heat dissipation. Advantageously, the presence of heat channel 106 may reduce heat propagation to areas adjacent to heat sink 100, due to the ease of heat propagation along heat channel 106. The orientation of heat channel 106 propagates heat easily in the x-direction. As a result of the easy avenue of heat propagation to vertex 109, a higher percentage of the heat (relative to a heat sink without heat channel 106) travels through heat channel 106. Thus, less heat is available to spread from the heat source in the z and y-directions. Additionally, the "T" shape of heat channel 106 and heat spreader 108 reduces use of anisotropic material, thereby reducing manufacturing cost of the component.

In this embodiment, heat channel 106 is made up of four individual strips of thermal material and heat spreader 108 is a single strip of thermal material. In one embodiment, each strip of thermal material is substantially the same width, which makes for easier and less expensive construction of thermal material. Since each strip within heat channel 106 and heat spreader 108 is of the same width, the thermal material for heat channel 106 and heat spreader 108 can be formed by cutting a sheet of thermal material into strips. The strips are then cut into portions of the desired length for heat channel 106 and heat spreader 108. In another embodiment, heat channel 106 is a single strip. In yet another embodiment, heat channel 106 and heat spreader 108 are strips which are not equal in width, each strip being custom made for the width of heat channel 106 and heat spreader 108 respectively.

Adjacent to heat channel 106 of thermal material are two blocks 110 of material to fill the space within heat sink 100. In one embodiment, blocks 110 are composed of copper to aid in conducting heat from heat generating components to heat sink 100. In other embodiments, blocks 110 are composed of other conducting material, or the space taken up by blocks 110 is filled with air, or left as a vacuum.

Figure 2:
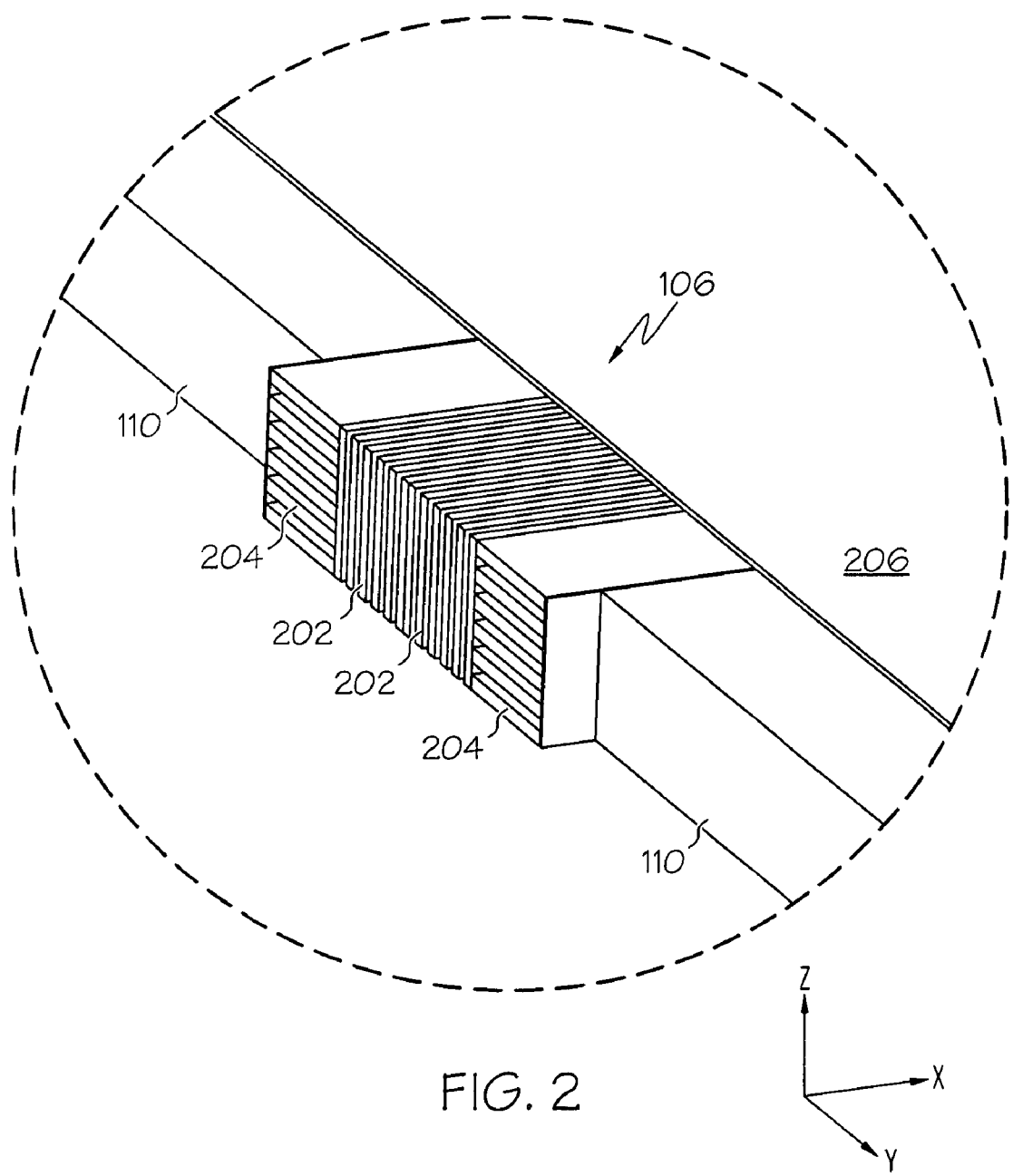
FIG. 2 is a detail view of a portion of the heat channel of the heat sink of FIG. 1.

Referring now to FIG. 2, one embodiment of heat channel 106 is shown which is composed of four strips of thermal material positioned adjacent to one another to form an array of strips extending from base 111 to vertex 109 of heat sink 100. The array of strips is composed of two inner strips 202 and two outer strips 204. Inner strips 202 are oriented such that the in-plane conduction of the thermal material is aligned with the x-z plane. Thus, heat propagates through inner strips 202 toward heat spreader 108 and outward to the sides 206 of heat sink 100. Outer strips 204 are oriented such that the in-plane conduction of the thermal material is aligned with the x-y plane. Thus, heat propagates through outer strips 204 toward heat spreader 108 and outward into blocks 110. The orientation of inner strips 202 and outer strips 204 allows heat to propagate quickly to heat spreader 106 and eventually be dissipated by fins on around vertex 109 of heat sink 100. In addition, the orientation of inner strips 202 allows some heat to be dissipated by fins along sides 206 of heat sink 100. In an alternative embodiment, inner strips 202 and outer strips 204 are oriented such that the in-plane conduction of each is aligned with one another. In yet another embodiment, each strip 202, 204 of heat channel 106 is oriented independently.

Figure 3:
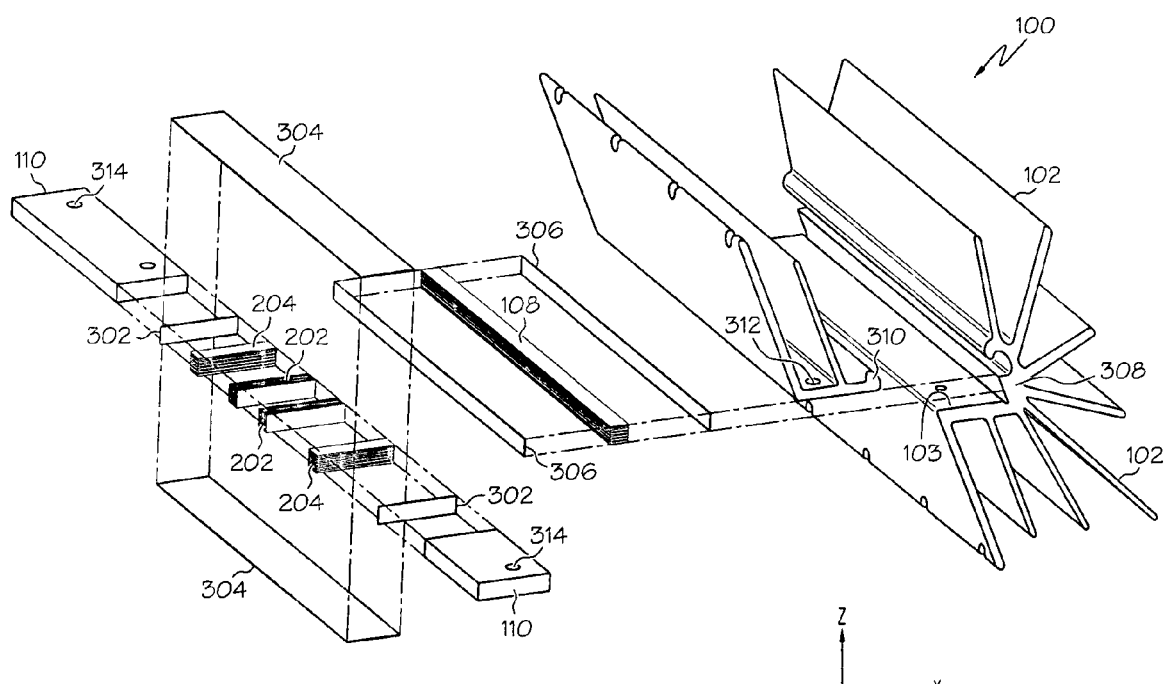
FIG. 3 is an exploded view of one embodiment of a heat sink having a heat channel and a heat spreader.

Referring now to FIG. 3, an exploded view of one embodiment of heat sink 100 is shown. In this embodiment, a thermal interface material is placed in each interface where heat conduction is desired between two conducting surfaces. A thermal interface material is a material having a low thermal resistance which is used to increase heat transfer between two surfaces by filling microscopic air gaps between the two surfaces. For example, thermal interface material 302 is placed between each outer strip 204 and the adjacent block 110 to improve heat conduction between each outer strip 204 and its respective block 110. Likewise, thermal interface material 304 is placed between the inner sides of heat sink 110 and the sides of strips 202, 204, and blocks 110. Additionally, thermal interface material 306 is placed between heat spreader 108 and strips 202, 204, and blocks 110, as well as between heat spreader 108 and heat sink 100. In one embodiment, thermal interface material 302, 304, 306 is a thermal pad which is installed as a solid and melts to fill the air gaps when heated. In other embodiments, thermal interface material is a thermal tape, thermal grease, thermal epoxy, or other thermal compound.

In this embodiment, heat spreader 108 of heat sink 100 is oriented such that the in-plane conduction is aligned with the x-y plane. Thus, heat propagates along the length of heat sink 100 and also to vertex 109 of heat sink 100. This allows surface-to-surface heat transfer from strips 202, 204, and blocks 110 into heat spreader 108 for spreading along heat sink 100. Although, heat spreader 108 is shown as a single strip of thermal material, in other embodiments, heat spreader 108 is composed of multiple strips of thermal material.

As shown in FIG. 3, the main body of heat sink 100 is composed of two sections, a fixed section 308 and a pivoting section 310. The two sections 308, 310 of heat sink 100 allow heat sink 100 to be easily assembled. To assemble heat sink 100, fixed section 308 and pivoting section 310 are separated. Heat channel 106, blocks 110, thermal interface material 302, 304, 306, and heat spreader 108 are placed against fixed section 308. Pivoting section 310 is then interlocked with fixed section 308 and closed to form the shape in FIG. 1. In one embodiment, a plurality of slots 312 are provided in the sides of pivoting section 310 and fixed section 308 for a fastener to compress pivoting section 310 and fixed section 308 together. Compressing pivoting section 310 against fixed section 308 improves contact, and therefore heat transfer, between pivoting section 310, fixed section 308 and heat channel 106, blocks 110, thermal interface material 302, 304, 306, and heat spreader 108. As shown in FIG. 3 blocks 110 also have a plurality of slots 314 which coincide with slots 312 in pivoting section 310 and fixed section 308. Advantageously, constructing heat sink 100 from two separate pieces, e.g., fixed section 308 and pivoting section 310, allows thermal interface material 302, 304, 306 to be placed in the correct location and to remain in the correct location during assembly of heat sink 100. More detail regarding the construction and interaction of fixed section 308 and pivoting section 310 is provided in the '561 App. which has been incorporated by reference.

Figure 4:
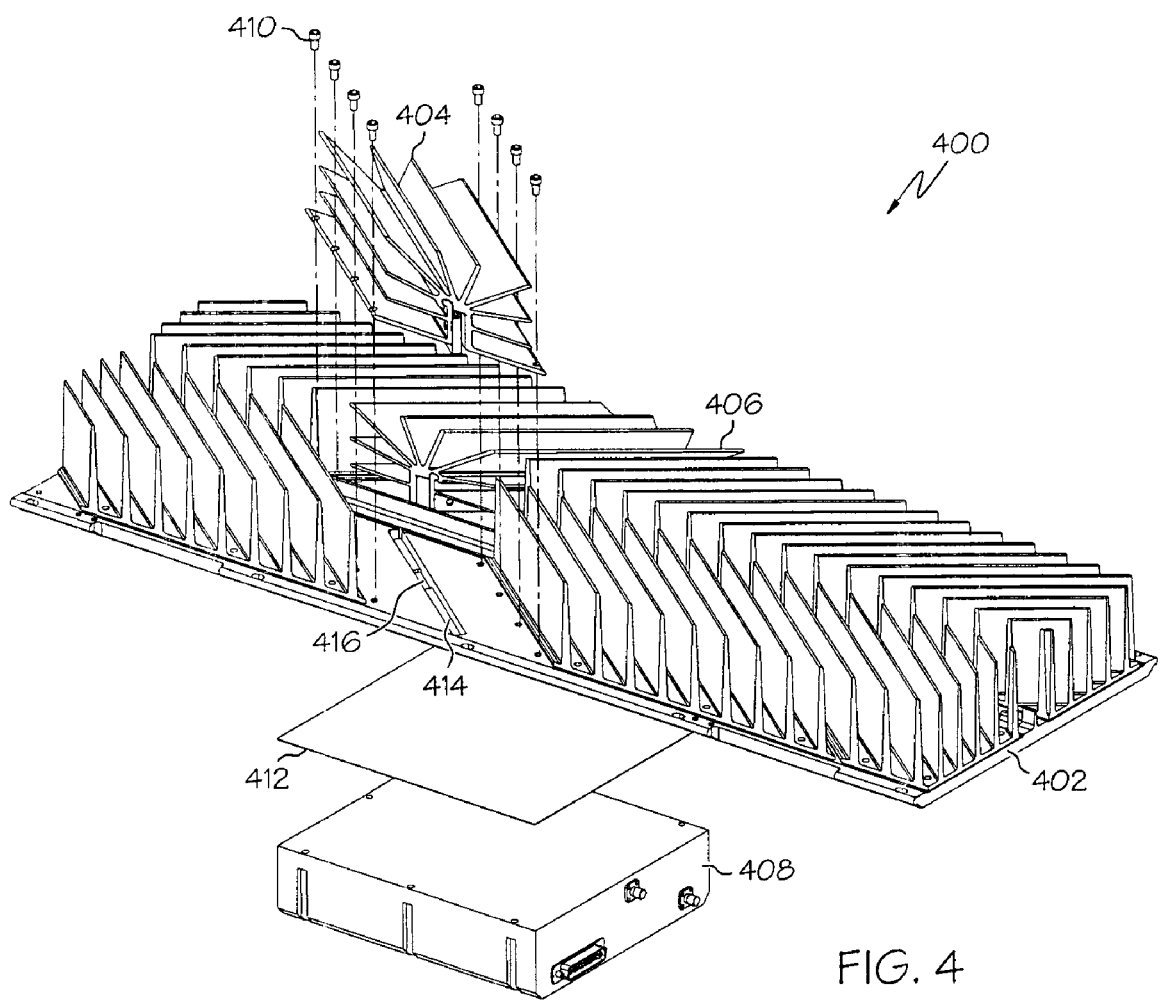
FIG. 4 is an exploded view of one embodiment of a system having a secondary heat sink with a heat channel and a heat spreader.

Referring now to FIG. 4, a system 400 using heat sink 100 as a hybrid fin (secondary heat sink) is illustrated. System 400 includes a primary heat sink 402 having a plurality of fins, a first hybrid fin 404, a second hybrid fin 406, and a heat generating component 408. Primary heat sink 402 dissipates heat from a plurality of heat generating components (e.g. heat generating component 408) which are thermally coupled to primary heat sink 402. In this embodiment, hybrid fin 404 acts as a secondary heat sink and increases the heat dissipation from component 408 by supplementing primary heat sink 402. Hybrid fin 404 supplements primary heat sink by channeling heat from component 408 into and across hybrid fin 404 while reducing heat dissipation from component 408 into primary heat sink 402. This results in more effective heat dissipation for component 408, as well as improving heat dissipation for components adjacent to component 408 by reducing the heat flow through primary heat sink 402. In one embodiment, primary heat sink 402 and hybrid fin 404 are designed and positioned such that the heat channel of hybrid fin 404 is located over the hottest spot among the plurality of components. In this embodiment, hybrid fin 404 is secured to primary heat sink 402 with a plurality of fasteners 410. In one embodiment, fasteners 410 are screws which extend through a plurality of slots in hybrid fin 404. In other embodiments, fasteners are rivets, bolts, glue, or other mechanisms as known to those skilled in the art.

Figure 6:
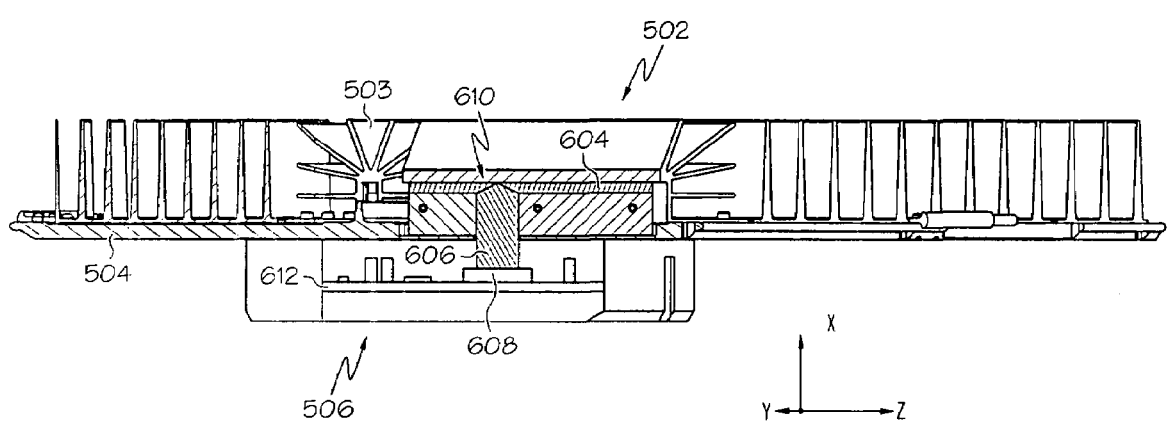
FIG. 6 is a cross-sectional view of one embodiment of the system of FIG. 5.

Component 408 is a housing containing a plurality of electronic chips. In this embodiment, a large amount of heat is generated by a single processor chip (e.g. as shown in FIG. 6) within component 408. The heat from the processor chip is coupled to the housing of component 408 along with the heat from other chips within component 408. In this embodiment, primary heat sink 402 and hybrid fin 404 are both coupled to component 408 to dissipate heat therefrom. Heat channel 106 of hybrid fin 404 is thermally coupled to component 408 near where the heat from processor chip is coupled to the housing of component 408. Thus, a large amount of the heat from processor chip is channeled from processor chip into heat channel 106 before spreading across the housing of component 408 and into primary heat sink 402. This increases the overall heat dissipation from component 408 by quickly and efficiently extracting heat from a high heat concentration area and dissipating the heat through hybrid fin 404. Additionally, this increases the overall heat dissipation of component 408 by reducing the temperature of the housing of component 408. This allows other chips within component 408 to dissipate heat more effectively to housing and into primary heat sink 402.

A thermal pad 412 is placed between component 408 and primary heat sink 402 to increase the thermal conduction between the surfaces of each. In this embodiment, blocks 110 also extend beyond the base of heat sink 100 as shown in FIGS. 1 and 2. Primary heat sink 402 has a groove 414 for blocks 110 and heat channel 106, as shown in FIG. 4. Additionally, a slot 416 extending completely through primary heat sink 402 allows heat channel 106 to directly contact component 408 and thermal pad 412.

As shown in FIG. 4, system 400 includes a second hybrid fin 406. Hybrid fin 406 provides additional heat dissipation for components coupled to primary heat sink 402 in a manner similar to hybrid fin 404. In one embodiment, hybrid fin 406 provides additional heat dissipation for component 408. In another embodiment, hybrid fin 406 provides heat dissipation for a component other than component 408. As is evident, although system 400 is illustrated with two (2) hybrid fins, system 400 could include one hybrid fin or more than two hybrid fins as desired for a particular application.

Although a specific embodiment of heat sink 100 is shown in FIG. 4, it should be understood that other embodiments are contemplated as within the scope of the invention, such as coupling directly to a chip, coupling to multiple heat generation locations, and others as known to those skilled in the art.

Advantageously, the design of system 400 is economical to manufacture. For example, as shown in FIG. 4, primary heat sink 402 and hybrid fins 402, 404 are formed by an extrusion process. The fins and other elements of primary heat sink 402, hybrid fin 404, and hybrid fin 406 each extend parallel to other fins and elements on the same structure. This allows each of primary heat sink 402, hybrid fin 404, and hybrid fin 406 to be formed through extrusion. As shown in FIG. 4, only the slots in primary heat sink 402 and hybrid fins 404, 406 for use in fastening each, require machining after the extrusion process.

Additionally, since primary heat sink 402, and hybrid fins 404, 406 are formed by extrusion, each can easily be manufactured to any length as desired for different applications.

In an alternative embodiment, hybrid fins 404, 406 do not have a full groove 103, and instead heat channel 106 and heat spreader 108 are positioned within a "T" shaped groove which is machined into each hybrid fin 404, 406. The "T" shaped groove is machined into fixed section 308, with heat channel 106, heat spreader 108, and thermal pads are positioned within the "T" shape. Pivoting section 310 is then closed onto fixed section 308 and secured. In other embodiments, the "T" shaped groove is machined into pivoting section 310 or partially machined into both fixed section 308 and pivoting section 310. Since in this embodiment hybrid fins 404, 406 have material adjacent each side of heat channel 106 and heat spreader 108 (with only a thermal pad in between), a separate piece of anisotropic material such as blocks 110 is not necessary.

As known to those skilled although primary heat sink 402 and hybrid fins 404, 406 are described as being formed through extrusion, primary heat sink 402 and hybrid fins 404, 406 may be formed other processes known to those skilled in the art such as casting, powder metallurgy, and others.

In one embodiment, primary heat sink 402, hybrid fin 404, and hybrid fin 406 are formed of aluminum. In alternative embodiments, primary heat sink 402, hybrid fin 404, and hybrid fin 406 are formed of steel. In other embodiments, primary heat sink 402, hybrid fin 404, and hybrid fin 406 are formed of other heat conductive materials, such as metal or other materials known to those skilled in the art.

In one embodiment, the components of system 400 are mounted to a chassis which houses the electronic components (e.g. component 408). The electronic components may be communications components which are mounted to a utility pole and connected to communication cables. Specifically, in one embodiment, the components of system 400 are mounted to a door of a chassis such that when the door is closed the electronic components are on the inside of the chassis to protect from the outdoor elements. Primary heat sink 402 and hybrid fins 404, 406 are on the outside of the chassis to dissipate heat to the surrounding environment. Primary heat sink 402 and hybrid fins 404, 406 are thermally coupled to the electronic components through the door. An example of such a system is illustrated and described in the '026 App. which has been incorporated by reference.

Figure 5:
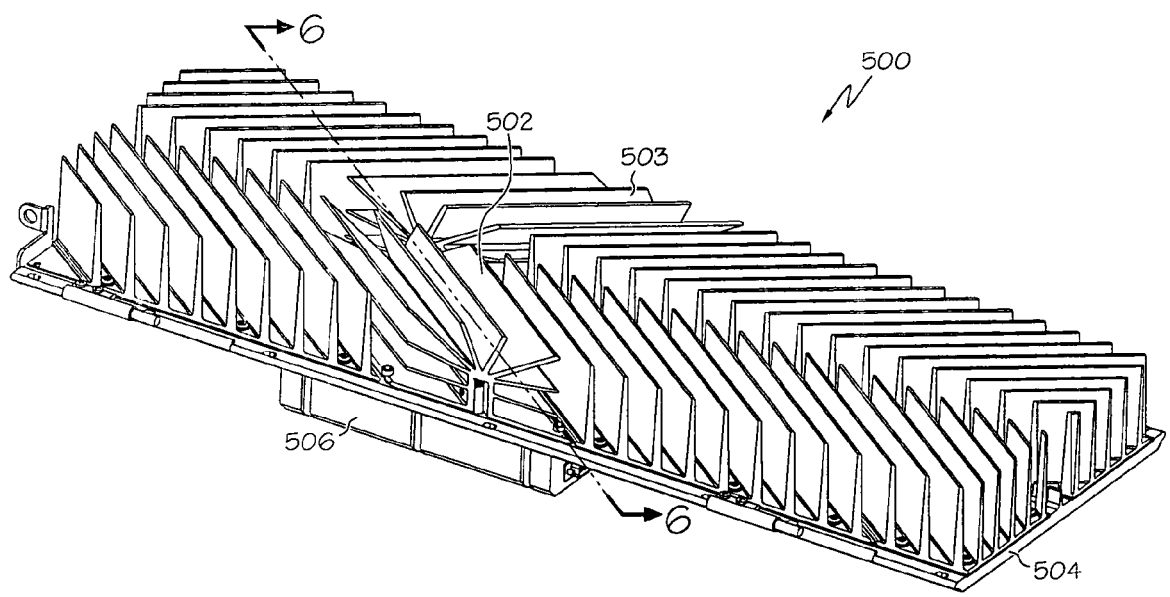
FIG. 5 is a perspective view of an alternative embodiment of a system having a secondary heat sink with a heat channel and a heat spreader.

Referring now to FIG. 5, an alternative embodiment of a system 500 including a first hybrid fin 502, a second hybrid fin 503, a primary heat sink 504, and a heat generating component 506 is shown. In this embodiment, the main body of hybrid fin 402 is one solid section. In this alternative embodiment, each of the components that are within hybrid fin 502 (incl. heat channel, blocks, thermal pads, and heat spreader) are slid into the groove within the main body of hybrid fin 502 prior to assembly with primary heat sink 504.

Referring now to FIG. 6, a cross-sectional view of one embodiment of hybrid fin 502 and heat generating component 506 is shown. In this embodiment, heat spreader 604 is oriented such that the in-plane conduction is aligned with the y-z plane, thus spreading heat along hybrid fin 502 and into sides of hybrid fin 502 (the y axis extends into and out of the page). Surface-to-surface heat transfer between heat channel 606 and heat spreader 604 is not available is this orientation, because heat spreader 604 does not conduct along the x axis, and thus does not conduct from the surface that heat channel 606 contacts. Thus, heat channel 606 and heat spreader 604 have an integrated coupling 610. In one example of an integrated coupling, heat channel 606 has two beveled edges and the beveled edges extend into heat spreader 604 to effectively transfer heat between heat channel 606 and heat spreader 604. The interaction of the beveled edges of heat channel 606 and heat spreader 604 is illustrated and described in the '561 App. which has been incorporated by reference. Although, heat spreader 604 is shown as a single strip of thermal material, in other embodiments, heat spreader 604 is composed of multiple strips of thermal material.

In one embodiment, as shown in FIGS. 1 and 2, heat channel 606 extends beyond the base of hybrid fin 502. This enables heat channel 606 to extend through primary heat sink 504 and couple more directly to the source of the heat in component 506. Advantageously, the closer that heat channel 606 is coupled to the heat source, the more quickly and effectively the heat can be channeled from the heat source into hybrid fin 502, which reduces the spreading of the heat into primary heat sink. Thus, as shown in FIG. 6, heat channel 606 extends to directly contact a heat generating chip 608 amongst a plurality of chips on a circuit board 612 within component 506.

Although specific embodiments have been illustrated and described herein, it will be appreciated by those of ordinary skill in the art that any arrangement, which is calculated to achieve the same purpose, may be substituted for the specific embodiment shown. This application is intended to base any adaptations or variations of the present invention. Therefore, it is manifestly intended that this invention be limited only by the claims and the equivalents thereof.

What is claimed is:

1. An apparatus for dissipating heat from a device, the apparatus comprising:
   a heat sink having an elongated shape and defining a groove,
   a heat spreader composed of an anisotropic thermal conductor, the heat spreader positioned at least partially within the groove of the heat sink and thermally coupled to the heat sink, the heat spreader oriented such that the thermal conductor propagates heat along a length of the heat sink; and
   a heat channel composed of an anisotropic thermal conductor, the heat channel positioned at least partially within the groove of the heat sink and thermally coupled to the heat spreader, the heat channel oriented to propagate heat towards the heat spreader.

2. The apparatus of claim 1, wherein the heat spreader is oriented for surface-to-surface heat transfer between the heat channel and the heat spreader.

3. The apparatus of claim 1, wherein the heat channel is composed of at least three strips of an anisotropic thermal conductor arranged into an array of strips positioned adjacent to one another, and wherein strips on outer edges of the array of strips are oriented to propagate heat towards an end of the heat sink, and wherein strips in between the strips on the outer edges of the array of strips are oriented to propagate heat towards a side of the heat sink.

4. The apparatus of claim 1, wherein the heat spreader is positioned along a vertex of the heat sink.

5. The apparatus of claim 1, wherein an isotropic thermal conductor is within the groove of the heat sink between a base of the heat sink and the heat spreader and adjacent the heat channel.

6. The apparatus of claim 1, wherein a heat conductive substance is within the groove of the heat sink between a base of the heat sink and the heat spreader and adjacent the heat channel.

7. The apparatus of claim 1, wherein the heat spreader and the heat channel form a "T" shape such that heat is channeled from a base of the heat sink toward a vertex of the heat sink by the heat channel and spread heat along the vertex of the heat sink by the head spreader.

8. The apparatus of claim 1, wherein the heat channel extends outward from a base of the heat sink.

9. The apparatus of claim 1, wherein a thermal interface material is placed between contacting heat conducting surfaces on the heat spreader, the heat channel, and the heat sink.

* * * * *